(12) United States Patent
Ikawa et al.

(10) Patent No.: US 9,153,953 B2
(45) Date of Patent: Oct. 6, 2015

(54) FAULT DETECTION APPARATUS (71) Applicant: Toshiba Mitsubishi-Electric Industrial Systems Corporation, Tokyo (JP)

(72) Inventors: Eiichi Ikawa, Tokyo (JP); Naoki Fujiwara, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 74 days.

(21) Appl. No.: 13/839,889

(22) Filed: Mar. 15, 2013

(65) Prior Publication Data

US 2013/0200713 A1 Aug. 8, 2013

Related U.S. Application Data (63) Continuation of application No. PCT/JP2010/067676, filed on Oct. 7, 2010.

(51) Int. Cl.
| | |
|---|---|
| *H02H 3/00* | (2006.01) |
| *H02H 3/18* | (2006.01) |
| *H02J 1/10* | (2006.01) |
| *H01L 31/02* | (2006.01) |
| *H02S 50/10* | (2014.01) |
| *G01R 31/02* | (2006.01) |

(52) U.S. Cl.
CPC ............ *H02H 3/18* (2013.01); *H01L 31/02021* (2013.01); *H02J 1/10* (2013.01); *H02S 50/10* (2014.12); *G01R 31/025* (2013.01); *Y02E 10/50* (2013.01); *Y10T 307/696* (2015.04)

(58) Field of Classification Search
USPC .......................................................... 361/84
See application file for complete search history.

(56) References Cited

U.S. PATENT DOCUMENTS

| | | | | |
|---|---|---|---|---|
| 8,218,274 B2* | 7/2012 | Hastings et al. | ................. | 361/42 |
| 8,508,896 B2* | 8/2013 | Paoletti et al. | ................... | 361/67 |
| 8,526,205 B2* | 9/2013 | Garrity | ............................ | 363/37 |
| 8,749,934 B2* | 6/2014 | Hackenberg | .................... | 361/84 |
| 2001/0023703 A1* | 9/2001 | Kondo et al. | .................. | 136/244 |
| 2008/0111517 A1* | 5/2008 | Pfeifer et al. | .................. | 320/101 |
| 2011/0006609 A1* | 1/2011 | Loh et al. | ......................... | 307/82 |

(Continued)

FOREIGN PATENT DOCUMENTS

| | | |
|---|---|---|
| CN | 1066507 | 11/1992 |
| CN | 1373368 | 10/2002 |
| CN | 101446615 | 6/2009 |

(Continued)

OTHER PUBLICATIONS

International Search Report from the Japanese Patent Office in corresponding PCT International Application No. PCT/JP2010/067676, mailed Dec. 21, 2010.

(Continued)

*Primary Examiner* — Ronald W Leja
(74) *Attorney, Agent, or Firm* — Finnegan, Henderson, Farabow, Garrett & Dunner, LLP (57) ABSTRACT

There is provided a fault detection apparatus including an open/close unit configured to open/close an electric path to pass a direct current forward, a reverse-current detector configured to detect a reverse current running through the electric path backward, and an opening unit configured to open the open/close unit when the reverse current is detected by the reverse-current detector.

9 Claims, 4 Drawing Sheets (56) References Cited

U.S. PATENT DOCUMENTS

2011/0301772 A1* 12/2011 Zuercher et al. .............. 700/293
2012/0139347 A1* 6/2012 Hackenberg ................... 307/71

FOREIGN PATENT DOCUMENTS

| CN | 201397372 | 2/2010 |
|----|-----------|--------|
| CN | 101789618 | 7/2010 |
| CN | 101853554 A | 10/2010 |
| JP | 2002-91586 | 3/2002 |
| JP | 2004-77309 | 3/2004 |
| JP | 2004-254386 | 9/2004 |
| JP | 2005-130609 | 5/2005 |
| JP | 2005-323444 | 11/2005 |
| WO | WO 2010/004738 | 1/2010 |

OTHER PUBLICATIONS

International Preliminary Report on Patentability and Written Opinion issued by the International Bureau of WIPO on May 8, 2013, for International Patent Application No. PCT/JP2010/067676.
Communication mailed by the State Intellectual Property Office of People's Republic of China in a counterpart Chinese application (CN 201080069408.4) dated Mar. 20, 2015.
Notification of the First Office Action from the State Intellectual Property Office of the People's Republic of China, dated Jul. 14, 2014, for counterpart Chinese Patent Application No. 201080069408.4, and English translation thereof (25 pages total).
First Office Action issued by the Japanese Patent Office on Mar. 24, 2015, for Japanese Patent Application No. 2012-537532, and English-language translation thereof.
Final Office Action from the Japan Patent Office mailed Jul. 22, 2014, for counterpart Japanese Patent Application No. 2012-537532, and English translation thereof (5 pages total).

* cited by examiner

FAULT DETECTION APPARATUS

CROSS REFERENCE TO RELATED APPLICATIONS

This application is a Continuation Application of PCT Application No. PCT/JP2010/067676, filed Oct. 7, 2010, the entire contents of which are incorporated herein by reference.

BACKGROUND OF THE INVENTION

1. Field of the Invention

The invention relates to a fault detection apparatus which detects a fault by a current.

2. Description of the Related Art

It is generally known to connect a plurality of batteries in parallel to obtain a large amount of electric power. For example, a large number of photovoltaic (PV) cells are connected in series and in parallel in a large-scale solar power generation system (PV array). In the solar power generation system, a fuse may be used to prevent an overcurrent caused by a short circuit or a ground fault. It is also known to measure a voltage value or a current value to evaluate the output of a solar battery (e.g., refer to Jpn. Pat. Appln. KOKAI Publication No. 2004-77309).

However, when natural energy is used to generate power as in the solar power generation system, a fixed amount of power is not always generated due to conditions of the natural environment such as sunlight. Therefore, an overcurrent may not run even when a fault such as a short circuit or a ground fault occurs. In this case, even if a fault such as a short circuit is detected by the detection of the overcurrent, the fault cannot be detected. Even if a fuse is provided, the fuse may not blow, and operation may be performed in a faulty condition.

BRIEF SUMMARY OF THE INVENTION

An object of the invention is to provide a fault detection apparatus capable of detecting a fault including no flow of an overcurrent.

In accordance with an aspect of embodiments of the invention, there is provided a fault detection apparatus including an open/close unit configured to open/close an electric path to pass a direct current forward; a reverse-current detector configured to detect a reverse current running through the electric bath backward; and an opening unit configured to open the open/close unit when the reverse current is detected by the reverse-current detector.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Hereinafter, embodiments of the invention will be described with reference to the drawings.

First Embodiment

Figure 1:
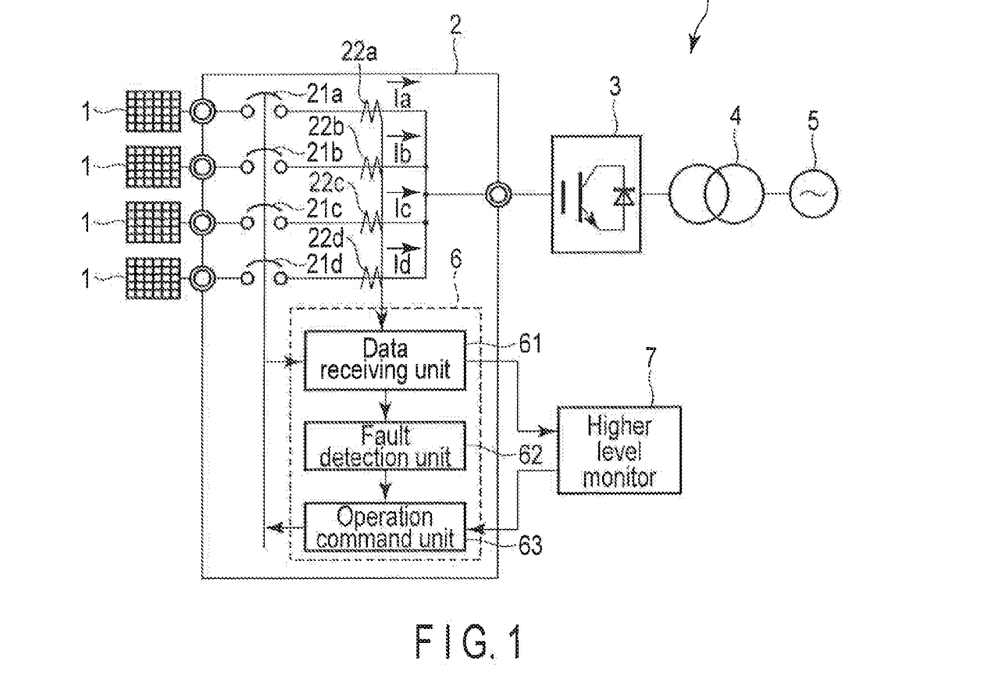
FIG. 1 is a block diagram showing the structure of a solar power generation system to which a junction box according to a first embodiment of the invention is applied.

FIG. 1 is a block diagram showing the structure of a solar power generation system 10 to which a junction box 2 according to the first embodiment of the invention is applied. The same parts in the drawings are denoted by the same reference signs and are not described in detail. Different parts are mainly described. Repeated explanations are not given in the following embodiments either.

The solar power generation system 10 includes PV cells 1, the junction box 2, an inverter 3, an interconnection transformer 4, an alternating current power system (grid) 5, and a higher level monitor 7.

The PV cells 1 are a battery to generate power by sunlight. The PV cells 1 constitute a PV array to increase the volume of generated power.

The junction box 2 is an apparatus to connect the PV cells 1 to the inverter 3. Connecting portions to connect the PV cells 1 are provided on the input, side of the junction box 2. When the PV cells 1 are connected to the input side of the junction box 2, the PV cells 1 are connected in parallel. As a result, the PV array is constituted. The output side of the junction box 2 is connected to the direct-current side of the inverter 3. Thus, the PV cells 1 (PV array) connected in parallel are connected to the direct-current side of the inverter 3.

An internal monitor 6 is mounted on the junction box 2. The internal monitor 6 monitors the inside of the junction box 2. For example, the internal monitor 6 measures currents Ia to Id output from the respective PV cells 1. That is, the internal monitor 6 has a function to monitor the current. The internal monitor 6 monitors the state of the junction box 2. When detecting the abnormalities of the currents Ia to Id output from the PV cells 1, the internal monitor 6 operates to parallel off the PV cells 1 in which the abnormal currents are detected. The internal monitor 6 sends, to the higher level monitor 7, various kinds of information for monitoring including the measurements of the currents Ia to Id.

The inverter 3 converts direct-current power generated by the PV cells 1 to alternating-current power which synchronizes with the alternating current power system 5. The inverter 3 supplies the alternating-current power resulting from the conversion to the alternating current power system 5 via the interconnection transformer 4. In this way, the solar power generation system 10 is interconnected to the alternating current power system 5.

The interconnection transformer 4 transforms the alternating-current voltage received from the inverter 3 into an alternating-current voltage suited to the alternating current power system 5.

The higher level monitor 7 is connected by a communication line to send information to or receive information from the internal monitor 6. The higher level monitor 7 monitors the solar power generation system 10 based on the various kinds of information received from the internal monitor 6 of the junction box 2. When detecting the abnormalities of the currents Ia to Id, the higher level monitor 7 outputs, to the internal monitor 6, a command to parallel off the PV cells 1 in which the abnormal currents are detected.

Now, the structure of the junction box 2 is described.

The junction box 2 includes circuit breakers (switches) 21a to 21d, current sensors 22a to 22d, and the internal monitor 6.

Each of the circuit breakers 21a to 21d is provided in an electric path between each of the connecting portions to connect the PV cells 1 and a connection point which connects the PV cells 1 in parallel. If the circuit breakers 21a to 21d are opened, the PV cells 1 corresponding to the circuit breakers 21a to 21d are paralleled off from the PV array. The circuit breakers 21a to 21d send signals indicating the open/close state to the internal monitor 6.

The current sensors 22a to 22d are sensors to detect the current values (current values output from the PV cells 1) Ia to Id running between the PV cells 1 and the connection point which connects the PV cells 1 in parallel. The current sensors 22a to 22d detect the flow direction from the PV cells 1 to the inverter 3 as a positive direction (forward direction). The current sensors 22a to 22d send the detected current values Ia to Id to the internal monitor 6.

The internal monitor 6 includes a data receiving unit 61, a fault detection unit 62, and an operation unit command unit 63.

The data receiving unit 61 receives the current values Ia to Id respectively detected by the current sensors 22a to 22d. The data receiving unit 61 receives the signals indicating the open/close state from the circuit breakers 21a to 21d. The data receiving unit 61 sends, to the higher level monitor 7 information regarding the current values Ia to Id and various kinds of information such as the signals indicating the open/close state from the circuit breakers 21a to 21d. The data receiving unit 61 also sends, to the fault detection unit 62, the current values Ia to Id received from the current sensors 22a to 22d.

The fault detection unit 62 detects a fault such as a short circuit or a ground fault based on the current values Ia to Id received from the data receiving unit 61. When detecting a fault, the fault detection unit 62 outputs, to the operation command unit 63, a fault detection signal indicating the detection of the fault.

When receiving the fault detection signal from the fault detection unit 62, the operation command unit 63 opens the circuit breakers 21a to 21d through which the fault-detected currents Ia to Id are running. At the same time, the operation command unit 63 may open all the circuit breakers 21a to 21d of the junction box 2. As a result, the PV cells 1 associated with the fault are paralleled off from the parallel connection. The operation command unit 63 also opens or closes the circuit breakers 21a to 21d based on an operation command output from the higher level monitor 7.

Figure 2:
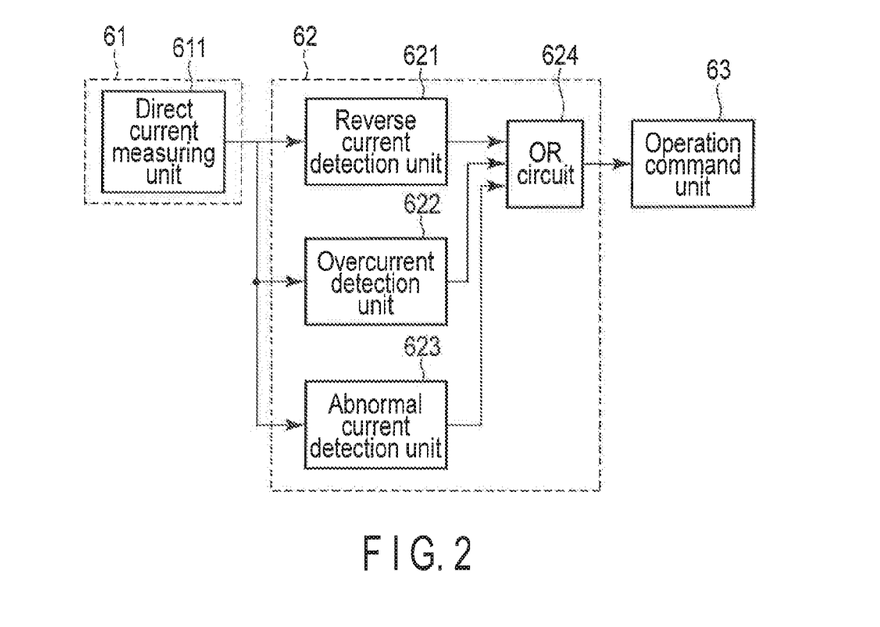
FIG. 2 is a block diagram showing the structure of a fault detection unit according to the first embodiment.

FIG. 2 is block diagram showing the structure of the fault detection unit 62 according to the present embodiment.

The fault detection unit 62 includes a reverse-current detection unit 621, an overcurrent detection unit 622, an abnormal current detection unit 623, and an OR circuit 624.

The data receiving unit 61 includes a direct current measuring unit 611. The direct current measuring unit 611 measures the direction and magnitude of the current values Ia to Id. The data receiving unit 61 outputs the measured current values Ia to Id to the reverse-current detection unit 621, the overcurrent detection unit 622, and the abnormal current detection unit 623.

The reverse-current detection unit 621 detects the negative current values Ia to Id running backward (the flow direction from the inverter 3 to the PV cells 1), among the current values Ia to Id measured by the data receiving unit 61. When detecting the negative current values Ia to Id, the reverse-current detection unit 621 determines that the detected current values Ia to Id are fault currents. When determining that the detected current values Ia to Id are fault currents, the reverse-current detection unit 621 outputs a fault detection signal to the OR circuit 624.

The overcurrent detection unit 622 detects the current values Ia to Id that are higher than a preset given current value among the current values Ia to Id measured by the data receiving unit 61. When detecting the current values Ia to Id that are higher than the given current value, the overcurrent detection unit 622 determines that the detected current values Ia to Id are fault currents. When determining that the detected current values Ia to Id are fault currents, the overcurrent detection unit 622 outputs a fault detection signal to the OR circuit 624.

The abnormal current detection unit 623 detects some of the current values Ia to Id measured by the data receiving unit 61 which are greatly different from the other current values Ia to Id. For example, the abnormal current detection unit 623 detects a current value which is higher than the average of the current values Ia to Id by a given standard (a predetermined value or a predetermined ratio) or more, or detects a current value which is lower than the average of the current values Ia to Id by the given standard or more. When detecting the current values Ia to Id which are greatly different from the other current values Ia to Id, the abnormal current detection unit 623 determines that the detected abnormal current values Ia to Id are fault currents. When determining that the detected current values Ia to Id are fault currents, the abnormal current detection unit 623 outputs a fault detection signal to the OR circuit 624.

When receiving the fault detection signal from one or more of the reverse-current detection unit 621, the overcurrent detection unit 622, and the abnormal current detection unit 623, the OR circuit 624 outputs the fault detection signal to the operation command unit 63 to open the circuit breakers 21a to 21d through which the fault currents run.

When receiving the fault detection signal from the OR circuit 624, the operation command unit 63 outputs an open command to open the circuit breakers 21a to 21d through which the fault currents run. At the same time, the operation command unit 63 may output the open command to all the circuit breakers 21a to 21d. The circuit breakers 21a to 21d which have received the open command are opened, and the PV cells 1 connected to the electric circuits in which the faults have occurred are paralleled off accordingly.

Figure 3:
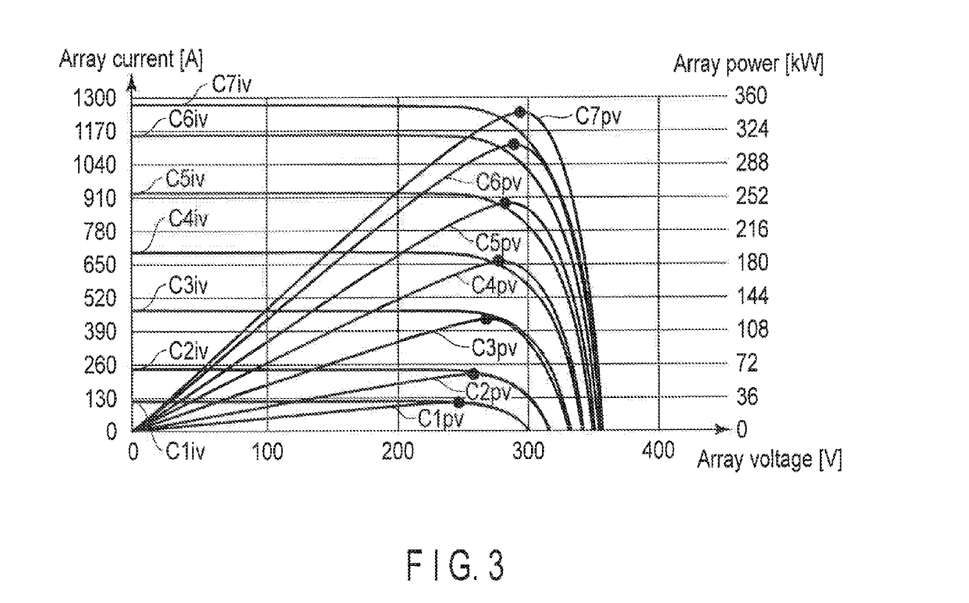
FIG. 3 is a characteristic chart showing the characteristics of power generated by a PV array according to the first embodiment.

FIG. 3 is a characteristic chart showing the characteristics of power generated by the PV array according to the present embodiment. The PV array has a structure in which the PV cells 1 are connected in series or in parallel.

Curves C1$iv$, C2$iv$, C3$iv$, C4$iv$, C5$iv$, C6$iv$, and C7$iv$ show the relation between the currents and the voltages output by the power generation by the PV array. Curves C1$pv$, C2$pv$, C3$pv$, C4$pv$, C5$pv$, C6$pv$, and C7$pv$ show the relation between the voltages and the powers output by the power generation by the PV array. The curves C1$iv$ and C1$pv$ represent characteristics at a power generation capacity of 0.1 kW/m^2. The curves C2$iv$ and C2$pv$ represent characteristics at a power generation capacity of 0.2 kW/m^2. The curves C3$iv$ and C3$pv$ represent characteristics at a power generation capacity of 0.4 kW/m^2. The curves C4*iv* and C4*pv* represent characteristics at a power generation capacity of 0.6 kW/m^2. The curves C5*iv* and C5*pv* represent characteristics at a power generation capacity of 0.8 kW/m^2. The curves C6*iv* and C6*pv* represent characteristics at a power generation capacity of 1.0 kW/m^2. The curves C7*iv* and C7*pv* represent characteristics at a power generation capacity of 1.1 kW/m^2.

As shown in FIG. 3, in the PV array, the magnitude of an array current even during a short circuit (an array voltage of 0 [V]) is not very different from the magnitude of an array current during normal operation (an array voltage of 200 to 300 [V]). An output current fluctuates due to sunlight conditions. Thus, it is difficult to detect all the faults such as short circuits by detecting an overcurrent alone. Accordingly, the fault detection unit 62 not only detects the overcurrent but also detects, as a fault, a current running in the backward direction which does not run at normal times or a current which is very different from the currents running through other electric paths.

According to the present embodiment, a reverse current or abnormal current is detected as a fault (failure), so that faults which cannot be detected by the detection of the overcurrent can be detected. Consequently, various kinds of faults can be detected.

The circuit breakers 21*a* to 21*d* which parallel off the PV cells 1 are provided in the junction box 2, and the corresponding (or all the) circuit breakers 21*a* to 21*d* are opened by the detection of the fault. Thus, the fault can be handled by the junction box 2 alone.

When a large number of PV cells 1 (batteries) are connected in parallel as in the PV array, the influence of some of the PV cells 1 that have broken down is limited if the power generation amount of the broken PV cells 1 is small compared with the overall power generation amount. In this case, the fault may not be found even by current measurement. Moreover, it is difficult in practice to measure the currents in all the electric paths in the large-scale solar power generation system 10 constituted of a large number of PV cells 1. To address these problems, the junction box 2 on which the internal monitor 6 is mounted can be used to effectively detect a fault in the power generation system 10.

Furthermore, if the information collected by the internal monitor 6 is sent to the higher level monitor 7, the higher level monitor 7 can externally monitor the operating state of the solar power generation system 10. For example, the higher level monitor can constantly monitor the currents Ia to Id running through the junction box 2 by receiving the current values Ia to Id measured by the data receiving unit 61. Therefore, the higher level monitor 7 can serve as a current monitor. The higher level monitor 7 can monitor the currents Ia to Id running through the junction box 2 to detect faults which cannot be detected by the internal monitor 6. When detecting a fault, the higher level monitor 7 can open the circuit breakers 21*a* to 21*d* via the internal monitor 6 to handle the detected fault.

Second Embodiment

Figure 4:
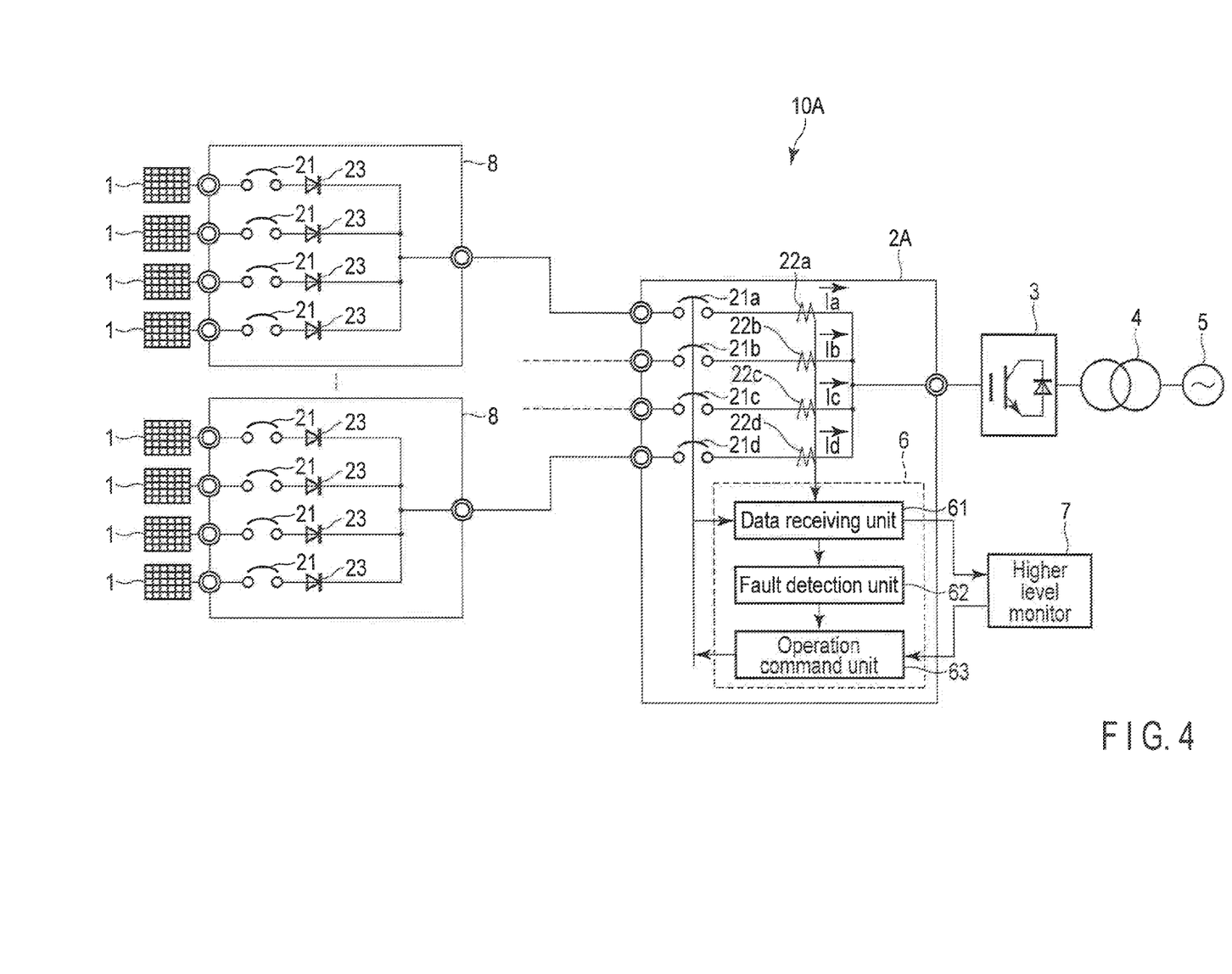
FIG. 4 is a block diagram showing the structure of a solar power generation system to which a collection box according to a second embodiment of the invention is applied.

FIG. 4 is a block diagram showing the structure of a solar power generation system 10A to which a collection box 2A according to the second embodiment of the invention is applied.

The solar power generation system 10A includes the PV cells 1, junction boxes 8, the collection box 2A, the inverter 3, the interconnection transformer 4, the alternating current power system 5, and the higher level monitor 7.

The junction boxes 8 are devices to connect the PV cells 1 in parallel. Connecting portions to connect the PV cells 1 are provided on the input sides of the junction boxes 8. When the PV cells 1 are connected to the junction boxes 8, the PV cells 1 are connected in parallel. As a result, the string-unit PV array is constituted. The output sides of the junction boxes are connected to the input side of the collection box 2A.

The junction boxes 8 include circuit breakers 21 and diodes 23.

Each of the circuit breakers 21 is provided in an electric path between each of the connecting portions to connect the PV cells 1 and a connection point, which connects the PV cells 1 in parallel. If the circuit breakers 21 are opened, the PV cells 1 corresponding to the circuit breakers 21 are paralleled off from the string-unit PV array.

Each of the diodes 23 is connected in series to the output side of each of the circuit breakers 21. This prevents the current running backward from the collection box 2A toward the PV cells 1.

The collection box 2A is a device to connect the string-unit PV arrays (the PV cells 1 connected in parallel by the junction boxes 8) to the inverter 3. Connecting portions to connect the junction boxes 8 are provided on the input side of the collection box 2A. When the output sides of the junction boxes 8 are connected to the input side of the collection box 2A, the string-unit PV arrays are connected in parallel. As a result, group-unit PV arrays are constituted. The output side of the collection box 2A is connected to the direct-current side of the inverter 3. As a result, the group-unit PV arrays are connected to the direct-current side of the inverter 3.

The collection box 2A is configured to connect not the PV cells 1 but the junction boxes 6 (PV arrays) to the input, side in the junction box 2 according to the first embodiment shown in FIG. 1. In other respects, the second embodiment is similar to the first embodiment.

Now, the operation of the internal monitor 6 of the collection box 2A is described.

Suppose that a short circuit has been just caused between the junction box 8 connected to the input side of the circuit breaker 21*a* of the collection box 2A and the input side of the collection box 2A.

In this case, currents Ib to Id running through circuit breakers 21*b* to 21*d* other than the circuit breaker 21*a* run in a positive direction. A current Ia running through the circuit, breaker 21*a* runs toward a short circuit point due to sneak currents of the currents Ib to Id running from the other circuit breakers 21*b* to 21*d*. Therefore, the current Is runs backward (negative direction).

Thus, the internal monitor 6 detects a reverse current of the current Ia by a current sensor 22*a*, and then opens the circuit breaker 21*a*. When the circuit breaker 21*a* is opened, the string-unit IV array connected to the input side of the circuit breaker 21*a* is paralleled off from the group-unit IV array. Consequently, the short-circuited part in the electric circuit is separated from the group-unit IV array.

According to the present embodiment, the internal monitor 6 is mounted on the collection box 2A, and it is thereby possible to obtain advantageous effects similar to the advantageous effects according to the first embodiment.

Third Embodiment

Figure 5:
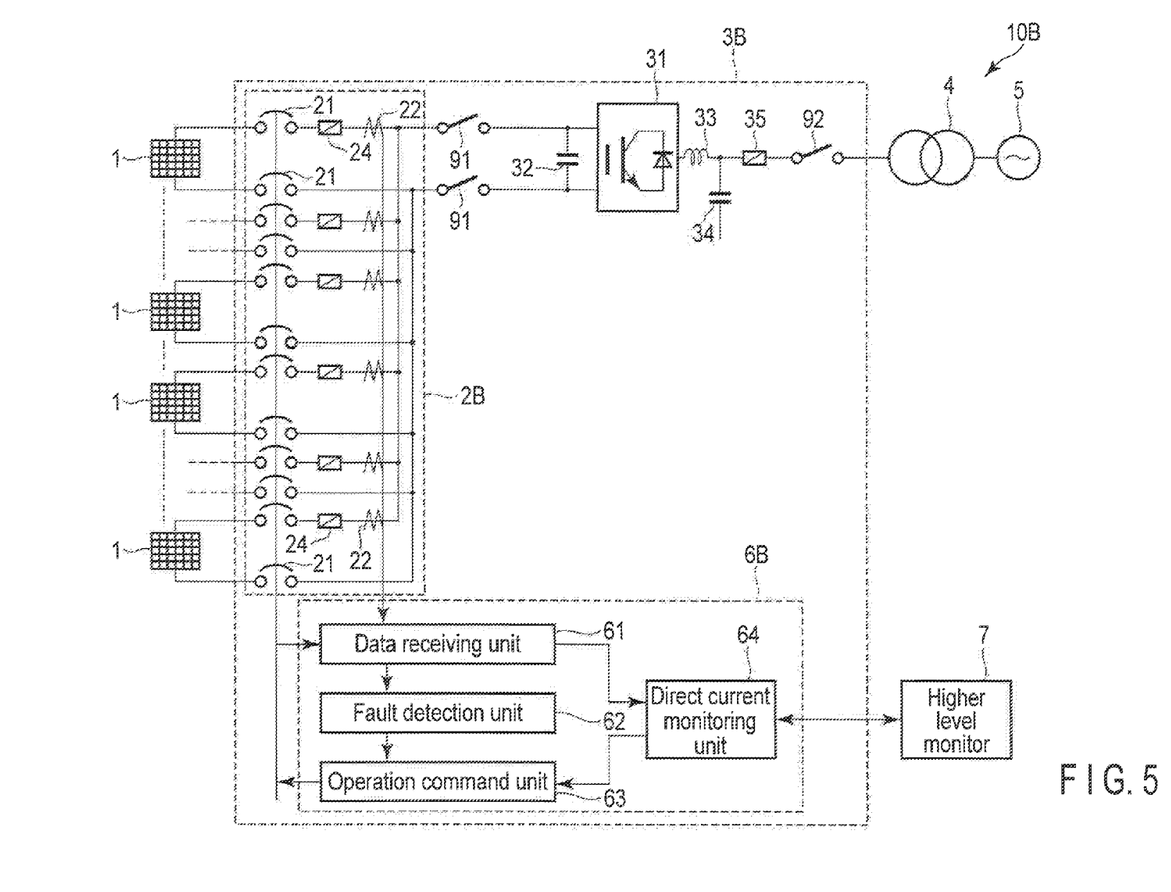
FIG. 5 is a block diagram showing the structure of a solar power generation system to which an inverter according to a third embodiment of the invention is applied.

FIG. 5 is a block diagram showing the structure of a solar power generation system 10B to which an inverter 33 according to the third embodiment of the invention is applied.

The solar power generation system 10B includes the PV cells 1, an inverter 3B, the interconnection transformer 4, the alternating current power system 5, and the higher level monitor 7.

The inverter 3B has a structure in which a collection box functional, unit 2B having a function equivalent to that of the junction box 2 (or the collection box 2A according to the second embodiment) and an internal monitor 6B are mounted on the inverter 3 in the first embodiment. The input side of the inverter 3B is connected to the PV cells 1. The output side of the inverter 33 is connected to the alternating current power system 5 via the interconnection transformer 4. The higher level monitor 7 is connected by a communication line to send information to or receive information from the internal monitor 6B.

The inverter 3B includes the collection box functional unit 23, the internal monitor 6B, a power conversion circuit 31, a smoothing capacitor 32, a reactor 33, a capacitor 34, a fuse 35, and contactors 91 and 92.

The smoothing capacitor 32 smoothes direct-current power supplied to the power conversion circuit 31.

The power conversion circuit 31 converts the direct-current power smoothed by the smoothing capacitor 32 to alternating-current power which synchronizes with the alternating current power system 5. The power conversion circuit 31 supplies the alternating-current power resulting from the conversion to the alternating current power system 5 via the interconnection transformer 4.

The reactor 33 and the capacitor 34 are provided on the output side of the power conversion circuit 31. The reactor 33 and the capacitor 34 constitute an alternating current filter. The alternating current filter suppresses a harmonic current which flows out from the inverter 3B to the alternating current power system 5.

The fuse 35 is provided on the output side of the alternating current filter constituted of the reactor 33 and the capacitor 34. The fuse 35 prevents an overcurrent which runs into the power conversion circuit 31 from the alternating current power system 5 toward a fault point in the event of a fault on the direct-current side of the power conversion circuit 31. The fuse 35 also prevents an overcurrent output from the power conversion circuit 31.

The contactor 91 is provided on the input side of the power conversion circuit 31. The contactor 91 connects or disconnects the power conversion circuit 31 and the collection box functional unit 2B.

The contactor 92 is provided on the output side of the fuse 35. The contactor 92 connects or disconnects the power conversion circuit 31 and the interconnection transformer 4.

Now, the structure of the collection box functional unit 2B is described.

The collection box functional unit 2B is a circuit to connect the PV cells 1 to the power conversion circuit 31. The collection box functional unit 2B is provided on the input side of the inverter 3B. Connecting portions to connect the PV cells 1 are provided on the input side of the inverter 3B. When the PV cells 1 are connected to the input side of the inverter 3B, the PV cells 1 are connected to the input side of the collection box functional unit 2B. When the PV cells 1 are connected to the input side of the collection box functional unit 2B, the PV cells 1 are connected in parallel. As a result, a PV array is constituted. The PIT cells 1 (PV array) connected in parallel are connected to the direct-current side of the power conversion circuit 31.

The collection box functional unit 2B includes circuit breakers 21, current sensors 22, and fuses 24.

The circuit breakers 21 are provided at two points of each of the PV cells 1: a positive pole and a negative pole. Each of the circuit breakers 21 is provided in an electric path between each of the connecting portions to connect the PV cells 1 and a connection point which connects the PV cells 1 in parallel. If the circuit breakers 21 are opened, the PV cells 1 corresponding to the circuit breakers 21 are paralleled off from the PV array. The circuit breakers 21 send signals indicating the open/close state to the internal monitor 6B.

The fuse 24 is provided on the output side of the circuit breaker 21 of each positive pole. The fuse 24 prevents an overcurrent from running from the power conversion circuit 31 toward a fault point on the side of the PV cells 1. For example, the smoothing capacitor 32 is charged during normal operation. Therefore, in the event of a fault on the side of the PV cells 1, the charge stored in the smoothing capacitor 32 causes an overcurrent to run from the smoothing capacitor 32 to the fault point. During operation, the contactors 91 and 92 are closed. Therefore, an overcurrent runs from the alternating current power system 5 toward the fault point via the power conversion circuit 31. Accordingly, the fuse 24 prevents these overcurrents.

The current sensor 22 is provided on the positive side of each of the fuses 24. The current sensors 22 are sensors to detect the current values on the positive pole side running between the PV cells 1 and the connection point which connects the PV cells 1 in parallel. The current sensors 22 detect the flow direction from the PV cells 1 to the power conversion circuit 31 as a positive direction (forward direction). The current sensors 22 send the detected current values to the internal monitor 6B.

The internal monitor 6B has a structure in which a direct current monitoring unit 64 is added in the internal monitor 6 according to the first embodiment shown in FIG. 1. In other respects, the internal monitor 6B is similar to the first embodiment.

The direct current monitoring unit 64 is configured to have a direct current monitor function the higher level monitor 7. The direct current monitoring unit 64 receives a current value measured by the data receiving unit 61. The direct current monitoring unit 64 displays the measured current value on a screen. The direct current monitoring unit 64 has an intermediary function between the internal monitor 6B and the higher level monitor 7. The intermediary function allows the higher level monitor 7 to send information to or receive information from the internal monitor 6B.

According to the present embodiment, the inverter 3B on which the collection box functional unit 2B and the internal monitor 6B are mounted is used constitute the solar power generation system 10B, and it is thereby possible to obtain advantageous effects similar to the advantageous effects according to the first embodiment.

Furthermore, the internal monitor 6B is mounted on the inverter 3B, and the inverter 3B can thereby serve as a direct current monitor.

In each of the embodiments, a fuse may be provided instead of the structure which detects an overcurrent and then opens the circuit breaker 21. These structures may be combined.

Although the PV cells 1 are connected to the input side of the inverter 3B in the third embodiment, the PV array constituted by the junction boxes 8 and others may be connected thereto.

It is to be noted that the present invention is not restricted to the foregoing embodiments, and constituent elements can be modified and changed into shapes without departing from the scope of the invention at an embodying stage. Additionally, various inventions can be formed by appropriately combining a plurality of constituent elements disclosed in the foregoing embodiments. For example, several constituent elements may be eliminated from all constituent elements disclosed in the embodiments. Furthermore, constituent elements in the different embodiments may be appropriately combined.

What is claimed is:

1. A connector that connects in parallel direct-current power supplies connected to an input side and connects the direct-current power supplies to a circuit on a load side connected to an output side, the connector comprising:
   open/close units configured to respectively open/close electric paths located between the direct-current power supplies and a parallel connection point which connects the direct-current power supplies in parallel;
   a reverse-current detector configured to detect a reverse current running through one of the electric paths from the output side to the input side;
   an abnormal current detector configured to detect an abnormal current of a current value that is higher or lower, by a predetermined value or a predetermined ratio, than an average current value determined based on current values of currents running through all of the electric paths; and
   an opening unit configured to open the open/close unit which opens/closes the electric path where the reverse current is detected, when the reverse current is detected by the reverse-current detector, and to open the open/close unit which opens/closes the electric path where the abnormal current is detected, when the abnormal current is detected by the abnormal current detector.

2. The connector according to claim 1, further comprising an overcurrent detector configured to detect an overcurrent running through the electric path,
   wherein the opening unit opens the open/close unit which opens/closes the electric path where the overcurrent is detected, when the overcurrent is detected by the overcurrent detector.

3. The connector according to claim 1, wherein the direct-current power supplies generate power by receiving light.

4. A power converter that connects in parallel direct-current power supplies connected to an input side to supply alternating-current power to a circuit on a load side connected to an output side, the power converter comprising:
   a power conversion circuit configured to convert direct-current power supplied from the direct-current power supplies connected in parallel to alternating-current power to be supplied to the circuit on the load side;
   open/close units configured to respectively open/close electric paths located between the direct-current power supplies and a parallel connection point which connects the direct-current power supplies in parallel;
   a reverse-current detector configured to detect a reverse current running through one of the electric paths from the output side to the input side;
   an abnormal current detector configured to detect an abnormal current of a current value that is higher or lower, by a predetermined value or a predetermined ratio, than an average current value determined based on current values of currents running through all of the electric paths; and
   an opening unit configured to open the open/close unit which opens/closes the electric path where the reverse current is detected, when the reverse current is detected by the reverse-current detector, and to open the open/close unit which opens/closes the electric path where the abnormal current is detected, when the abnormal current is detected by the abnormal current detector.

5. The power converter according to claim 4, further comprising an overcurrent detector configured to detect an overcurrent running through the electric path,
   wherein the opening unit opens the open/close unit which opens/closes the electric path where the overcurrent is detected, when the overcurrent is detected by the overcurrent detector.

6. The power converter according to claim 4, wherein the direct-current power supplies generate power by receiving light.

7. A power generation system comprising:
   direct-current power supplies connected in parallel;
   a power conversion circuit configured to convert direct-current power supplied from the direct-current power supplies to alternating-current power to be supplied to a circuit on a load side;
   open/close units configured to respectively open/close electric paths located between the direct-current power supplies and a parallel connection point which connects the direct-current power supplies in parallel;
   a reverse-current detector configured to detect a reverse current running from the load side to the direct-current power supplies through the electric paths located between the direct-current power supplies and the parallel connection point;
   an abnormal current detector configured to detect an abnormal current of a current value that is higher or lower, by a predetermined value or a predetermined ratio, than an average current value determined based on current values of currents running through all of the electric paths; and
   an opening unit configured to open the open/close unit which opens/closes the electric path where the reverse current is detected, when the reverse current is detected by the reverse-current detector, and to open the open/close unit which opens/closes the electric path where the abnormal current is detected, when the abnormal current is detected by the abnormal current detector.

8. The power generation system according to claim 7, further comprising an overcurrent detector configured to detect an overcurrent running through the electric path,
   wherein the opening unit opens the open/close unit which opens/closes the electric path where the overcurrent is detected, when the overcurrent is detected by the overcurrent detector.

9. The power generation system according to claim 7, wherein the direct-current power supplies generate power by receiving light.

* * * * *